(12) United States Patent
Lee et al.

(10) Patent No.: US 11,313,891 B2
(45) Date of Patent: Apr. 26, 2022

(54) DISPLAY DEVICE

(71) Applicant: Samsung Display Co., Ltd., Yongin-si (KR)

(72) Inventors: Chung Seok Lee, Hwaseong-si (KR); Eun Byul Kim, Gwangju (KR); Kyeong Yeol Heo, Cheonan-si (KR)

(73) Assignee: Samsung Display Co., Ltd.

( * ) Notice: Subject to any disclaimer, the term of this patent is extended or adjusted under 35 U.S.C. 154(b) by 529 days.

(21) Appl. No.: 15/978,975

(22) Filed: May 14, 2018

(65) Prior Publication Data

US 2019/0064239 A1 Feb. 28, 2019

(30) Foreign Application Priority Data

Aug. 28, 2017 (KR) .................. 10-2017-0108737

(51) Int. Cl.
*G01R 27/20* (2006.01)
*G09G 3/00* (2006.01)
*G01R 31/70* (2020.01)

(52) U.S. Cl.
CPC ........... *G01R 27/205* (2013.01); *G01R 31/70* (2020.01); *G09G 3/006* (2013.01); *G09G 2300/0426* (2013.01); *G09G 2330/12* (2013.01)

(58) Field of Classification Search
CPC ........... G09G 2300/0426; G09G 3/006; G09G 2330/12; G09G 3/00; G09G 3/3648; G01R 31/70; G01R 27/205; G01R 27/20; G01R 31/04; G02F 1/1309; G02F 2001/136254
See application file for complete search history.

(56) References Cited

U.S. PATENT DOCUMENTS

| | | | |
|---|---|---|---|
| 6,940,301 B2 | 9/2005 | Chen | |
| 2002/0079920 A1* | 6/2002 | Fujikawa | G02F 1/1309 |
| | | | 324/754.07 |
| 2005/0127936 A1* | 6/2005 | Chen | G09G 3/006 |
| | | | 324/760.01 |
| 2010/0295567 A1 | 11/2010 | Chang | |

(Continued)

FOREIGN PATENT DOCUMENTS

| | | | |
|---|---|---|---|
| JP | 2006-276115 A | 10/2006 | |
| JP | 2008-233423 A | 10/2008 | |

(Continued)

*Primary Examiner* — Jermele M Hollington
*Assistant Examiner* — Suresh K Rajaputra
(74) *Attorney, Agent, or Firm* — Innovation Counsel LLP

(57) ABSTRACT

A display device including a first substrate including a display area and a non-display area, a circuit film connected to the first substrate, a printed circuit board (PCB) connected to the circuit film, and a first inspection pad, a second inspection pad, and a third inspection pad located in the non-display area and a bridge configured to electrically connect the first inspection pad, the second inspection pad, and the third inspection pad. The circuit film includes a first line electrically connected to the first inspection pad, a second line electrically connected to the second inspection pad, a third line electrically connected to the third inspection pad, and a branch point configured to branch at least one line from the first line, the second line, and the third line into two sub-lines. The PCB includes a test pad unit connected to the first line, the second line, and the third line.

20 Claims, 11 Drawing Sheets

(56) References Cited

U.S. PATENT DOCUMENTS

2011/0175800 A1* 7/2011 Mizumaki ............ H05K 1/0268
                                                            345/87
2013/0155037 A1* 6/2013 Kim .................... G09G 3/3225
                                                           345/204
2016/0202298 A1  7/2016 Brahma et al.

FOREIGN PATENT DOCUMENTS

| | | |
|---|---|---|
| JP | 2009-223265 A | 10/2009 |
| JP | 2010-060865 A | 3/2010 |
| JP | 2012-226058 A | 11/2012 |
| JP | 2016-058410 A | 4/2016 |
| KR | 2001-0018565 A | 3/2001 |
| KR | 2003-0065131 A | 8/2003 |
| KR | 10-2006-0041447 A | 5/2006 |
| KR | 10-2011-0009247 A | 1/2011 |
| KR | 10-2012-0073765 A | 7/2012 |
| KR | 10-2014-0084632 A | 7/2014 |
| KR | 10-2014-0122481 A | 10/2014 |
| KR | 10-2015-0068050 A | 6/2015 |
| KR | 10-2015-0084572 A | 7/2015 |
| KR | 10-2015-0112106 A | 10/2015 |
| KR | 10-2017-0033966 A | 3/2017 |
| KR | 10-2017-0047787 A | 5/2017 |

* cited by examiner

DISPLAY DEVICE

CROSS REFERENCE TO RELATED APPLICATIONS

This application claims priority from Korean Patent Application No. 10-2017-0108737 filed on Aug. 28, 2017 in the Korean Intellectual Property Office, the disclosure of which is incorporated herein by reference in its entirety.

BACKGROUND

1. Field of the Disclosure

The present disclosure relates to a display device.

2. Description of the Related Art

The importance of display devices has increased with the development of multimedia. Accordingly, various kinds of display devices, such as a liquid crystal display (LCD) device, an organic light emitting diode (OLED) display device, etc., have been used.

Among the display devices, an LCD device is one of the most widely used flat panel display (FPD) devices. The LCD includes two substrates on which electric-field generating electrodes (e.g., a pixel electrode and a common electrode) are formed and a liquid crystal layer interposed therebetween. An electric field is generated in the liquid crystal layer by applying a voltage to the electric-field generating electrodes. Thus, the orientation of liquid crystal molecules is determined in the liquid crystal layer, and the polarization of incident light is controlled to display an image.

Among the display devices, an OLED display device displays an image by using an organic light emitting diode (OLED) configured to generate light due to recombination of electrons and holes. The OLED display device has advantages of high response speed, high luminance, a wide viewing angle, and low power consumption.

SUMMARY

Aspects of the present disclosure provide a display device which allows a resistance thereof to be measured in real-time during a process.

Aspects of the present disclosure also provide a method of measuring a resistance capable of measuring a resistance of a display device in real-time during a process.

It should be noted that objects of the present disclosure are not limited to the above-described objects, and other objects of the present disclosure will be apparent to those skilled in the art from the following descriptions.

According to an aspect of the present disclosure, there is provided a display device including: a first substrate including a display area in which a plurality of pixel units are located and a non-display area adjacent to the display area, a circuit film connected to the first substrate, a printed circuit board (PCB) connected to the circuit film, and a first inspection pad, a second inspection pad, and a third inspection pad located in the non-display area and a bridge configured to electrically connect the first inspection pad, the second inspection pad, and the third inspection pad. The circuit film includes a first line electrically connected to the first inspection pad, a second line electrically connected to the second inspection pad, a third line electrically connected to the third inspection pad, and a branch point configured to branch at least one line selected from the first line, the second line, and the third line into two sub-lines. The PCB includes a test pad unit connected to the first line, the second line, and the third line.

According to another aspect of the present disclosure, there is provided a display device including: a first substrate including a display area in which a plurality of pixel units are located and a non-display area adjacent to the display area, a circuit film connected to the first substrate, a PCB connected to the circuit film, a first out bonding unit, a second out bonding unit, and a third out bonding unit configured to electrically connect the first substrate with the circuit film, and a bridge located in the non-display area and configured to electrically connect the first out bonding unit, the second out bonding unit, and the third out bonding unit. The circuit film includes a first line electrically connected to the first out bonding unit, a second line electrically connected to the second out bonding unit, a third line electrically connected to the third out bonding unit, and a branch point configured to branch at least one line selected from the first line the second line and the third line into two sub-lines. The PCB includes a test pad unit connected to the first line, the second line, and the third line.

According to still another aspect of the present disclosure, there is provided a method of measuring a resistance of a display device. The method includes: preparing a display device including a first substrate including a display area in which a plurality of pixel units are located and a non-display area adjacent to the display area, a circuit film connected to the first substrate, a PCB connected to the circuit film, a first out bonding unit, a second out bonding unit, and a third out bonding unit configured to electrically connect the first substrate with the circuit film, a first in bonding unit, a second in bonding unit, a third in bonding unit, a fourth in bonding unit, and a fifth in bonding unit configured to electrically connect the circuit film with the PCB, and a bridge located on the first substrate and configured to electrically connect the first out bonding unit, the second out bonding unit, and the third out bonding unit, wherein the circuit film includes a first line electrically connected to the first out bonding unit, a second line electrically connected to the second out bonding unit, a third line electrically connected to the third out bonding unit, a first branch point configured to branch the first line into a first sub-line and a second sub-line, and a second branch point configured to branch the second line into a third sub-line and a fourth sub-line, the PCB includes a first test pad, a second test pad, a third test pad, a fourth test pad, and a fifth test pad, and the first sub-line is electrically connected to the first test pad, the second sub-line is electrically connected to the second test pad, the third sub-line is electrically connected to the third test pad, the fourth sub-line is electrically connected to the fourth test pad, and the third line is electrically connected to the fifth test pad; and measuring a resistance existing in the first in bonding unit and the second in bonding unit by connecting two terminals of a voltmeter having the two terminals to the first test pad and the second test pad.

Specific particulars of other embodiments are included in detailed descriptions and drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
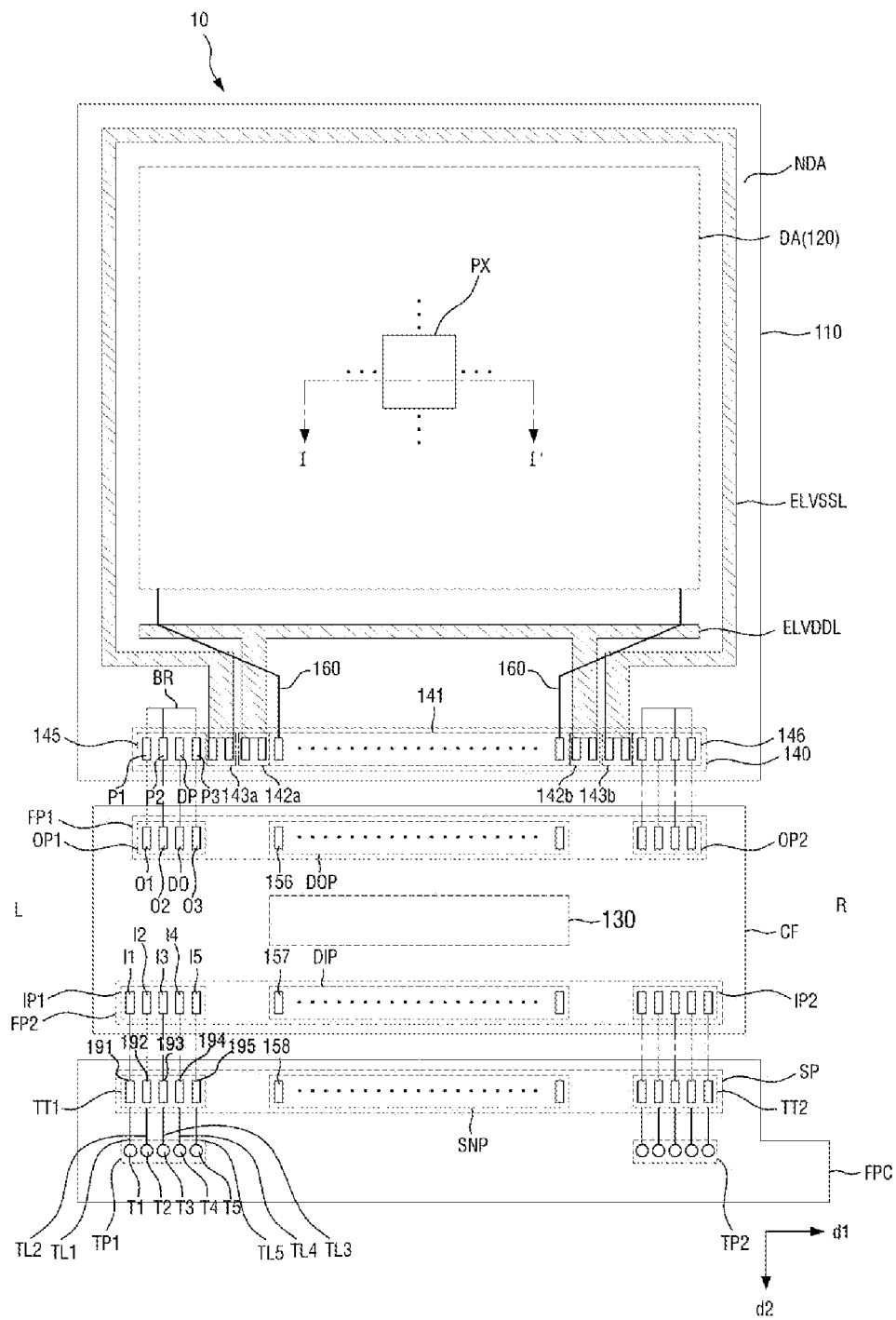
FIG. 1 is a schematic layout of a display device according to an exemplary embodiment of the present disclosure.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
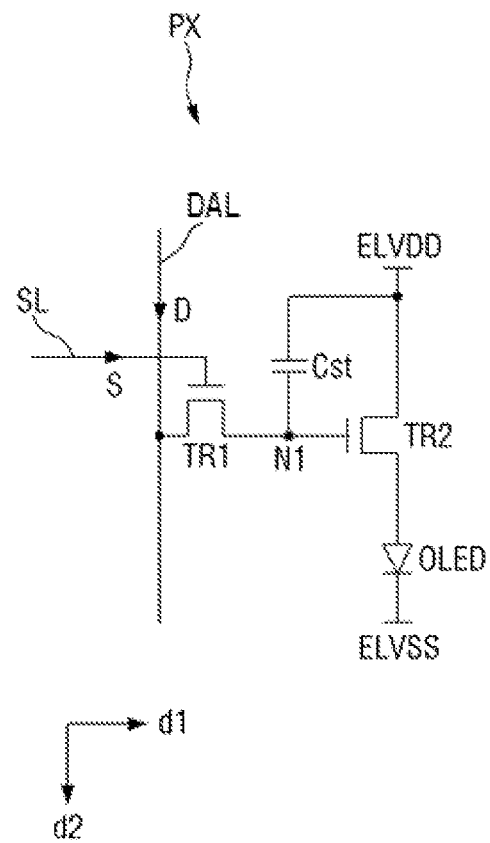
FIG. 2 is an equivalent circuit diagram of a pixel unit shown in FIG. 1 according to an exemplary embodiment of the present disclosure.
Figure 3:
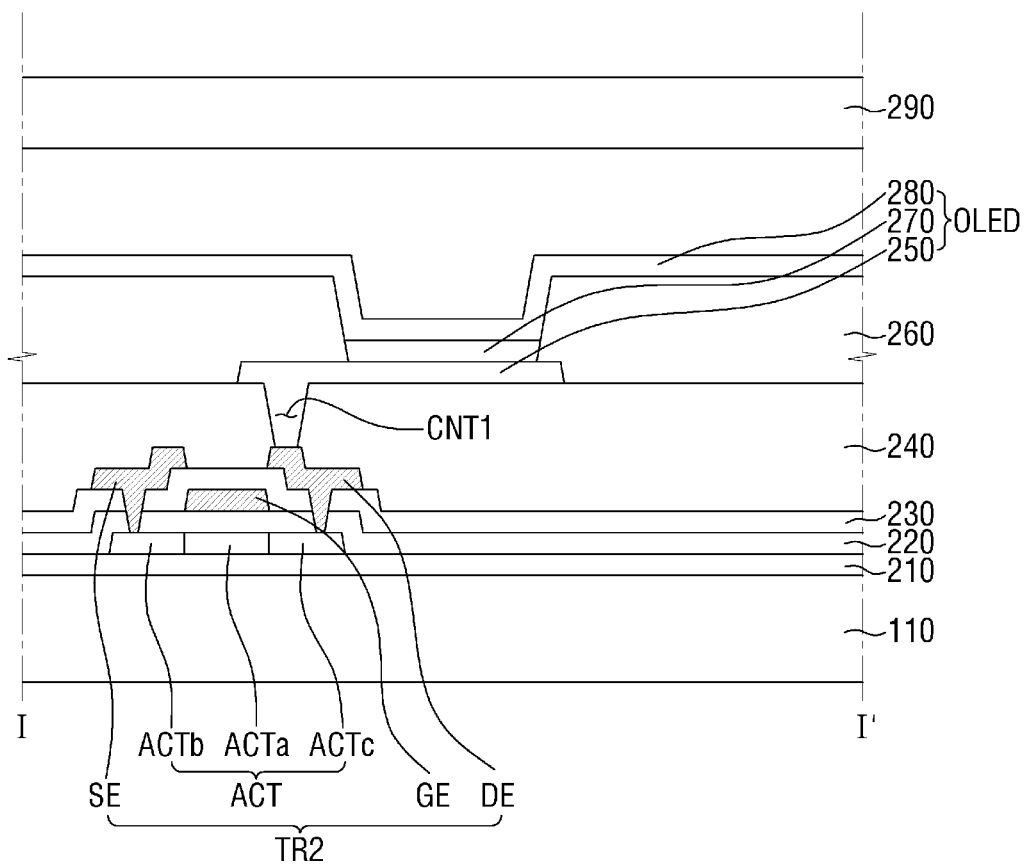
FIG. 3 is a cross-sectional view taken along line I-I' of FIG. 1.
Figure 4:
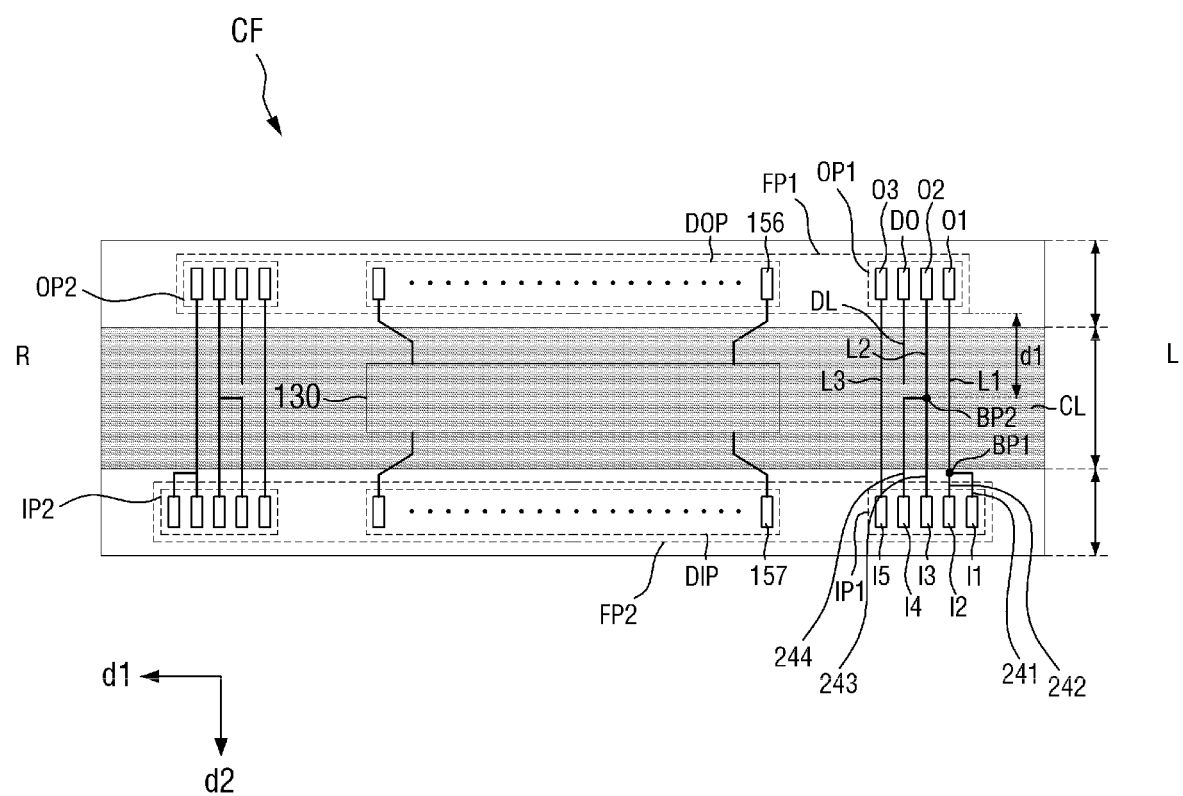
FIG. 4 is a partial layout of FIG. 1 according to an exemplary embodiment of the present disclosure.
Figure 5:
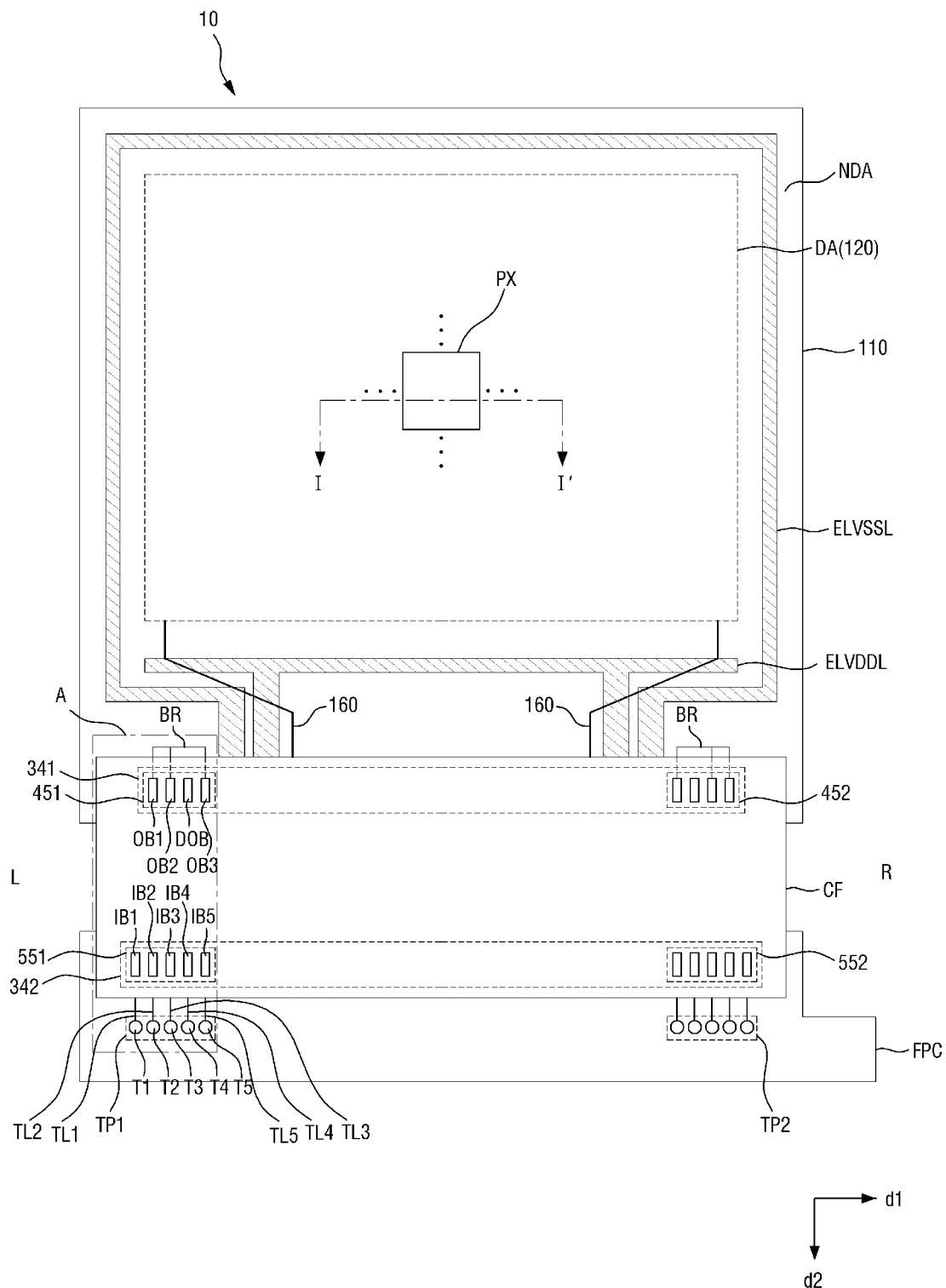
FIG. 5 is a schematic plan view of the display device according to the exemplary embodiment of the present disclosure.
Figure 6:
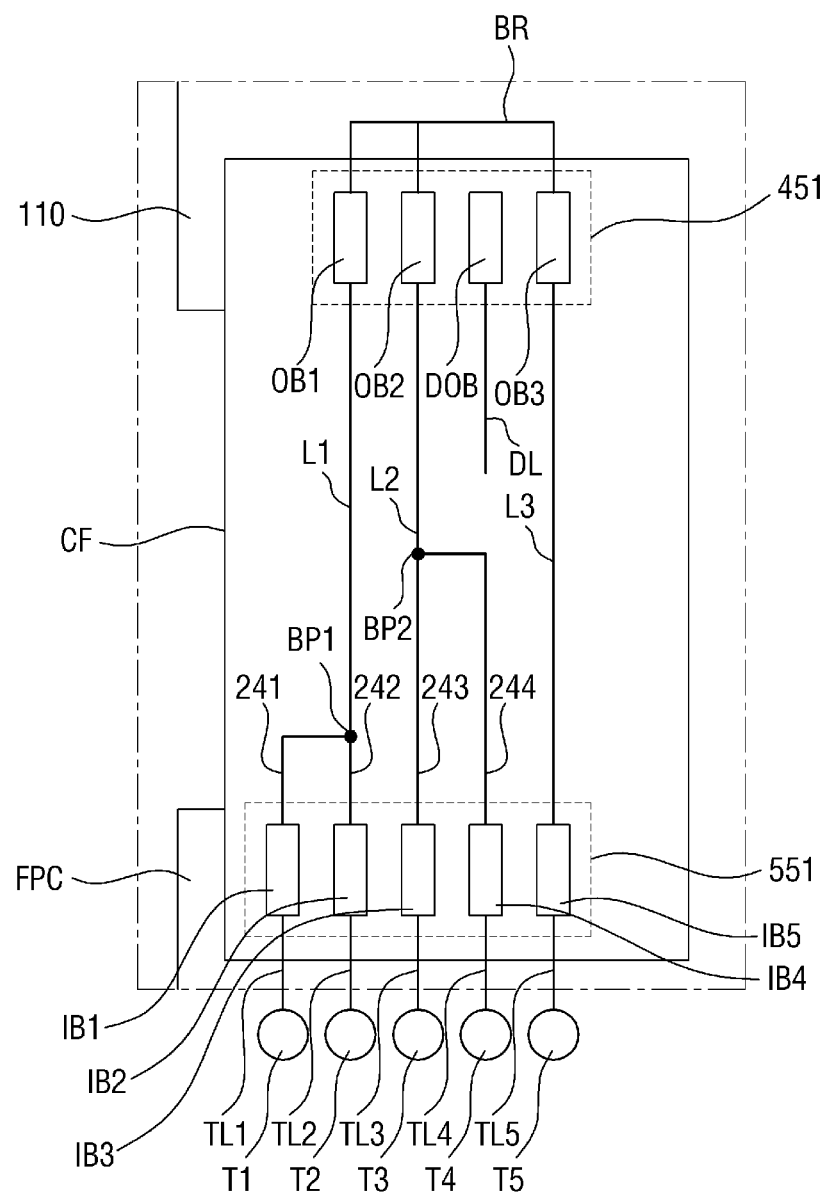
FIG. 6 is an enlarged layout of portion A of FIG. 5 according to an exemplary embodiment of the present disclosure.

FIG. 1 is a schematic layout of a display device according to an exemplary embodiment of the present disclosure. FIG. 2 is an equivalent circuit diagram of a pixel unit shown in FIG. 1 according to an exemplary embodiment of the present disclosure. FIG. 3 is a cross-sectional view taken along line I-I' of FIG. 1. FIG. 4 is a partial layout of FIG. 1 according to an exemplary embodiment of the present disclosure. FIG. 5 is a schematic plan view of the display device according to the exemplary embodiment of the present disclosure. FIG. 6 illustrates an enlarged layout of portion A of FIG. 5.

Referring to FIGS. 1 to 6, a display device 10 according to the exemplary embodiment of the present disclosure includes a first substrate 110, a circuit film CF, and a printed circuit board (PCB) FPC.

The first substrate 110 may be an insulating substrate. In an exemplary embodiment, the first substrate 110 may include a material, such as glass, quartz, and a polymer resin. Here, the polymer material may be polyethersulphone (PES), polyacrylate (PA), polyarylate (PAR), polyetherimide (PEI), polyethylenenapthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

A material included in the first substrate 110 may vary according to a direction in which the display device 10 emits light. In an exemplary embodiment, when an image is displayed toward the first substrate 110, the first substrate 110 is formed of a transparent material. By contrast, when an image is displayed in a direction opposite the first substrate 110, the first substrate 110 may not be necessarily formed of a transparent material. In an exemplary embodiment, the first substrate 110 may include at least one selected from the group consisting of iron, chromium, manganese, nickel, titanium, molybdenum, an invar alloy, and stainless steel (SUS).

The first substrate 110 may include a display area DA and a non-display area NDA.

The display area DA is defined as a region configured to display images. The display unit 120 is located in the display area DA. A plurality of pixel units PX configured to embody images are located on the display unit 120.

Hereinafter, a plurality of pixel units PX according to an exemplary embodiment will first be described with reference to FIG. 2.

Each of the pixel units PX may include a first switching device TR1, a second switching device TR2, a storage capacitor Cst, and an organic light emitting diode OLED. That is, the display device 10 according to the exemplary embodiment of the present disclosure may be an organic light emitting diode display device.

The first switching device TR1 may include a control electrode electrically connected to a scan line SL extending in a first direction d1, one electrode electrically connected to a data line DAL extending in a second direction d2, and another electrode electrically connected to a first node N1. Thus, the first switching device TR1 may perform a switching operation in response to a scan signal provided through the scan line SL, and provide a data signal D from the data line DAL to the first node N1. That is, the first switching device TR1 may be a switch transistor. In an exemplary embodiment, the first direction d1 may intersect the second direction d2. FIG. 2 illustrates an example in which the first direction d1 is a row direction and the second direction d2 is a column direction.

The second switching device TR2 may include a control electrode electrically connected to the first node N1, one electrode electrically connected to a first driving voltage line ELVDDL (see FIG. 1) configured to provide a first driving voltage ELVDD, and another electrode electrically connected to a second driving voltage line ELVSSL (see FIG. 1) configured to provide a second driving voltage ELVSS. Here, each of the first driving voltage ELVDD and the second driving voltage ELVSS may be a direct-current (DC) voltage, and the second driving voltage ELVSS may have a lower voltage level than the first driving voltage ELVDD.

Thus, the second switching device TR2 may perform a switching operation in response to the data signal D provided through the first switching device TR1 and control an amount of a driving current flowing into the organic light emitting diode OLED. That is, the second switching device TR2 may be a driving transistor.

The storage capacitor Cst may include one electrode electrically connected to the first node N1 and the other electrode electrically connected to the first driving voltage line ELVDDL configured to provide the first driving voltage ELVDD. A voltage difference between a voltage provided to the first node N1 and the first driving voltage ELVDD may be charged in the storage capacitor Cst.

However, components included in the pixel unit PX and connections among the respective components are not limited to those shown in FIG. 2. That is, in another exemplary embodiment, the pixel unit PX may further include a plurality of switching devices configured to compensate for a threshold voltage of the second switching device TR2 or degradation of the organic light emitting diode OLED.

Referring back to FIG. 1, the non-display area NDA is located outside the display area DA and defined as a region configured not to display images. In an exemplary embodiment, the non-display area NDA may be located to surround the display area DA. Although FIG. 1 illustrates a case in which the non-display area NDA surrounds the display area DA, the present disclosure is not limited thereto. In another exemplary embodiment, the non-display area NDA may be located adjacent to only one side or the other side of the display area DA. Alternatively, non-display areas NDA may be located adjacent to two sides of the display area DA.

In an exemplary embodiment, an output pad unit 140 may extend along an edge of the first substrate 110 in the first direction d1. The output pad unit 140 may be electrically connected to the PCB FPC as will be described below.

The output pad unit 140 may include a first pad unit 141, second pad units 142a and 142b, third pad units 143a and 143b, a first inspection pad unit 145, and a second inspection pad unit 146.

The first pad unit 141 may include a plurality of pads to which a driving signal is applied by a driving integrated circuit (IC) 130 which will be described below.

The first pad unit 141 may be connected to a plurality of input lines 160 so that the driving signal may be transmitted to the pixel units PX.

The second pad units 142a and 142b may include a second pad unit 142a located at one side of the first pad unit 141 and a second pad unit 142b located at the other side of the first pad unit 141.

The second pad units 142a and 142b may be electrically connected to the first driving voltage line ELVDDL. That is, the second pad units 142a and 142b may externally receive the first driving voltage ELVDD and may provide the first driving voltage ELVDD to the first driving voltage line ELVDDL.

The third pad units 143a and 143b may include a third pad unit 143a located at one side of the first pad unit 141 and a third pad unit 143b located at the other side of the first pad unit 141. The third pad units 143a and 143b may be electrically connected to the second driving voltage line ELVSSL. That is, the third pad units 143a and 143b may externally receive the second driving voltage ELVSS and may provide the second driving voltage ELVSS to the second driving voltage line ELVSSL.

That is, each of the second pad units 142a and 142b and the third pad units 143a and 143b may be referred to as a driving voltage pad unit. Meanwhile, the number of pads configured to apply a driving voltage and the arrangement of the pads are not limited to those shown in FIG. 1.

A first inspection pad unit 145 may be located at a left side of the first pad unit 141, and a second inspection pad unit 146 may be located at a right side of the first pad unit 141.

The second inspection pad unit 146 may be substantially the same as the first inspection pad unit 145. Accordingly, the first inspection pad unit 145 will mainly be described below. Descriptions of the first inspection pad unit 145 may be applied to the second inspection pad unit 146.

In an exemplary embodiment, the first inspection pad unit 145 may include a first inspection pad P1, a second inspection pad P2, a dummy inspection pad DP, and a third inspection pad P3.

The first inspection pad P1, the second inspection pad P2, the dummy inspection pad DP, and the third inspection pad P3 may be spaced apart from one another and located in the first direction d1.

The display device 10 according to the exemplary embodiment of the present disclosure may further include a bridge BR configured to electrically connect the first inspection pad P1, the second inspection pad P2, and the third inspection pad P3.

The bridge BR may connect one ends of the first inspection pad P1, the second inspection pad P2, and the third inspection pad P3 and electrically connect the first inspection pad P1, the second inspection pad P2, and the third inspection pad P3.

In an exemplary embodiment, the bridge BR may be formed of the same material and on the same layer as the first inspection pad P1, the second inspection pad P2, and the third inspection pad P3. That is, the bridge BR may be integrally formed with the first inspection pad P1, the second inspection pad P2, and the third inspection pad P3.

In another exemplary embodiment, the bridge BR may be formed of a different material and on a different layer from the first inspection pad P1, the second inspection pad P2, and the third inspection pad P3. When the bridge BR is located on the different layer from the first inspection pad P1, the second inspection pad P2, and the third inspection pad P3, the bridge BR may include at least one contact (not shown) to electrically connect the first inspection pad P1, the second inspection pad P2, and the third inspection pad P3.

Thereafter, a sectional shape of the pixel unit PX will be described with reference to FIG. 3.

A buffer layer 210 may be located on the first substrate 110. The buffer layer 210 may prevent external moisture and oxygen from penetrating the first substrate 110. Also, the buffer layer 210 may planarize the surface of the first substrate 110. In an exemplary embodiment, the buffer layer 210 may include any one of a silicon nitride ($SiN_x$) film, a silicon oxide ($SiO_2$) film, and a silicon oxynitride ($SiO_xN_y$) film. The buffer layer 210 may be omitted according to the kind of the first substrate 110 or process conditions.

A semiconductor layer including a semiconductor pattern ACT may be located on the buffer layer 210. The semiconductor layer will be described on the basis of the semiconductor pattern ACT. In an exemplary embodiment, the semiconductor pattern ACT may be formed of one selected from the group consisting of polycrystalline silicon (poly-Si), single crystalline silicon, low-temperature poly-Si, amorphous silicon (a-Si), and an oxide semiconductor or a combination thereof. In an exemplary embodiment, the semiconductor pattern ACT may include a channel region ACTa undoped with impurities and source and drain regions ACTb and ACTc doped with impurities. The source region ACTb is located at one side of the channel region ACTa and electrically connected to a source electrode SE that will be described below. The drain region ACTc is located at the other side of the channel region ACTa and electrically connected to a drain electrode DE that will be described below.

A first insulating layer 220 may be located on a semiconductor layer including the semiconductor pattern ACT. In an exemplary embodiment, the first insulating layer 220 may be a gate insulating layer. In an exemplary embodiment, the first insulating layer 220 may be formed of one selected from an inorganic insulating material (e.g., silicon oxide (SiOx) and silicon nitride (SiNx)) and an organic insulating material (e.g., benzocyclobutene (BCB), an acrylic material, and polyimide) or a combination thereof.

A gate conductive structure including a gate electrode GE may be located on the first insulating layer 220. The gate conductive structure may include the scan line SL shown in FIG. 2. The gate electrode GE may extend from the scan line SL and overlap the semiconductor pattern ACT. The gate conductive structure may include, for example, at least one of an aluminum (Al)-based metal including an aluminum alloy, a silver (Ag)-based metal including a silver alloy, a copper (Cu)-based metal including a copper alloy, a molybdenum (Mo)-based metal including a molybdenum alloy, chromium (Cr), titanium (Ti), and tantalum (Ta).

A second insulating layer 230 may be located on the gate conductive structure including the gate electrode GE. The second insulating layer 230 may be formed of one selected from an inorganic insulating material (e.g., silicon oxide (SiOx) and silicon nitride (SiNx)) and an organic insulating material (e.g., BCB, an acrylic material, and polyimide) or a combination thereof.

A data conductive structure including the source electrode SE and the drain electrode DE may be located on the second insulating layer 230. The data conductive structure may include not only the data line DAL shown in FIG. 2 but also the first driving voltage line ELVDDL and the second driving voltage line ELVSSL shown in FIG. 1. The source electrode SE and the drain electrode DE may be spaced apart from each other on the second insulating layer 230. The data conductive structure may include at least one selected from the group consisting of a metal, an alloy, a metal nitride, a conductive metal oxide, and a transparent conductive material. In an exemplary embodiment, the data conductive structure may include a single film or a multilayered structure, which includes nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). Also, an alloy formed by adding at least one element selected from the group consisting of titanium (Ti), zirconium (Zr), tungsten (W), tantalum (Ta), niobium (Nb), platinum (Pt), hafnium (Hf), oxygen (O), and nitrogen (N) to the above-described metal may be used as a material of the source electrode SE and the drain electrode DE.

The above-described semiconductor pattern ACT, gate electrode GE, source electrode SE, and drain electrode DE may constitute the second switching device TR2. Although FIG. 3 illustrates a case in which the second switching device TR2 is a top-gate type device, the present disclosure is not limited thereto. That is, the second switching device TR2 may be a bottom-gate type device.

Meanwhile, a material of the semiconductor pattern ACT included in the first switching device TR1 may be different from a material of the semiconductor pattern ACT included in the second switching device TR2. For example, both a switching device including an oxide semiconductor and a switching device including low-temperature poly-Si may be included in one pixel unit PX in consideration of functions of a switching device or a process of fabricating the switching device.

A planarization layer 240 may be located on the data conductive structure. Since the planarization layer 240 is even without steps, luminous efficiency of a pixel electrode 250 and an organic emission layer (EML) 270, which will be described below, may increase. In an exemplary embodiment, the planarization layer 240 may include an organic material. For example, the planarization layer 240 may include at least one selected from the group consisting of polyimide, polyacryl, and polysiloxane. In another exemplary embodiment, the planarization layer 240 may include an inorganic material or a compound layer including an inorganic material and an organic material. A first contact hole CNT1 through which at least a portion of the drain electrode DE is exposed may be formed in the planarization layer 240.

The pixel electrode 250 may be located on the planarization layer 240. The pixel electrode 250 may be electrically connected to the drain electrode DE exposed by the first contact hole CNT1. That is, the pixel electrode 250 may be an anode which is a hole injection electrode. When the pixel electrode 250 is the anode, the pixel electrode 250 may include a material having a high work function to facilitate the injection of holes. Also, the pixel electrode 250 may be a reflective electrode, a transflective electrode, or a transmissive electrode. In an exemplary embodiment, the pixel electrode 250 may include a reflective material. In an exemplary embodiment, the reflective material may include at least one selected from the group consisting of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

In an exemplary embodiment, the pixel electrode 250 may be formed as a single film, but the present disclosure is not limited thereto. That is, the pixel electrode 250 may be formed to have a multilayered structure including at least two stacked materials.

When the pixel electrode 250 is formed to have the multilayered structure, in an exemplary embodiment, the pixel electrode 250 may include a reflective film and a transparent or semi-transparent electrode located on the reflective film. In another exemplary embodiment, the pixel electrode 250 may include a reflective film and a transparent or semi-transparent electrode located under the reflective film. For example, the pixel electrode 250 may have a triple-layered structure including indium tin oxide (ITO)/Ag/ITO, but the present disclosure is not limited thereto.

In this case, the transparent or semi-transparent electrode may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A pixel defining film 260 may be located on the pixel electrode 250. The pixel defining film 260 includes an opening through which at least a portion of the pixel electrode 250 is exposed. The pixel defining film 260 may include an organic material or an inorganic material. In an exemplary embodiment, the pixel defining film 260 may include a material such as photoresist, a polyimide resin, an acrylic resin, a silicon compound, or a polyacrylic resin.

The organic EML 270 may be located on the pixel electrode 250 and the pixel defining film 260. More specifically, the organic EML 270 may be located in a region of the pixel electrode 250, which is exposed through the opening of the pixel defining film 260. In an exemplary embodiment, the organic EML 270 may cover at least a portion of a sidewall of the pixel defining film 260.

In an exemplary embodiment, the organic EML 270 may emit one of red light, blue light, and green light. In another exemplary embodiment, the organic EML 270 may emit white light or one of cyan light, magenta light, and yellow light. When the organic EML 270 emits white light, the organic EML 270 may include a white emission material or have a stacked structure of a red emission layer, a green emission layer, and a blue emission layer to emit white light.

A common electrode 280 may be located on the organic EML 270 and the pixel defining film 260. In an exemplary embodiment, the common electrode 280 may be entirely formed on the organic EML 270 and the pixel defining film 260. In an exemplary embodiment, the common electrode 280 may be a cathode. In an exemplary embodiment, the common electrode 280 may include at least one selected from the group consisting of lithium (Li), calcium (Ca), lithium fluoride/calcium (LiF/Ca), LiF/Al, Al, Ag, and Mg. Also, the common electrode 280 may include a material having a low work function. In an exemplary embodiment, the common electrode 280 may be a transparent or semi-transparent electrode including at least one selected from the group consisting of ITO, IZO, ZnO, $In_2O_3$, IGO, and AZO.

The above-described pixel electrode 250, organic EML 270, and common electrode 280 may constitute the organic light emitting diode OLED. However, the present disclosure is not limited thereto, and the organic light emitting diode OLED may have a multilayered structure that further include a hole injection layer (HIL), a hole transport layer (HTL), an electron transport layer (ETL), and an electron injection layer (EIL).

The second substrate 290 may be located opposite the first substrate 110. The second substrate 290 may be combined with the first substrate 110 by an additional sealing member. In an exemplary embodiment, the second substrate 290 may be a transparent insulating substrate. When the second substrate 290 is the transparent insulating substrate, the transparent insulating substrate may be a glass substrate, a quartz substrate, or a transparent resin substrate.

Although not shown, a polarization layer, an input sensing layer, and a window layer may be located on the second substrate 290.

The polarization layer may reduce a reflection rate of externally incident light. In an exemplary embodiment, the polarization layer may include a retarder and a polarizer. The polarization layer may be omitted. When the polarization layer is omitted, a black matrix BM and a color filter CF may be located on the second substrate 290 to improve color separation due to reflection of external light.

In an exemplary embodiment, the input sensing layer may be directly formed on the second substrate 290. In another exemplary embodiment, the input sensing layer may be combined with the second substrate 290 by an additional adhesive member.

Referring back to FIG. 1, the display device 10 according to the exemplary embodiment may further include a circuit film CF connected to the first substrate 110.

The circuit film CF may be electrically connected to one portion of the first substrate 110, that is, a portion of the first substrate 110 on which the output pad unit 140 is formed. That is, a region of the circuit film CF may be adhered to the portion of the first substrate 100 on which the output pad unit 140 is formed.

In an exemplary embodiment, the circuit film CF may be flexible and be bent or folded. In an exemplary embodiment, the circuit film CF may include polyethylene terephthalate (PET) or polyimide (PI). However, a material of the circuit film CF is not limited to the above-described examples.

The circuit film CF may include a first film pad unit FP1, a second film pad unit FP2, and a driving IC 130.

In an exemplary embodiment, the first film pad unit FP1 may be electrically connected to the output pad unit 140 formed on the first substrate 110. That is, a plurality of pads included in the first film pad unit FP1 may correspond and be electrically connected to a plurality of pads included in the output pad unit 140 one-to-one, one-to-n, or n-to-one.

In an exemplary embodiment, the first film pad unit FP1 and the output pad unit 140 may be electrically connected by an anisotropic conductive film (ACF) interposed therebetween. Here, the anisotropic conductive film may include an adhesive resin and a plurality of conductive particles dispersed in the adhesive resin.

However, a method of connecting the first film pad unit FP1 and the output pad unit 140 is not limited thereto. In another exemplary embodiment, the first film pad unit FP1 may be connected to the output pad unit 140 by bringing each of the pads of the first film pad unit FP1 into direct contact with a corresponding one of the pads of the output pad unit 140.

In an exemplary embodiment, the first film pad unit FP1 may include a driving out pad unit DOP, a first out pad unit OP1 located at a left side L of the driving out pad unit DOP, and a second out pad unit OP2 located at a right side R of the driving out pad unit DOP.

The driving out pad unit DOP may include a plurality of driving out pads 156 arranged in the first direction d1. The driving out pad unit DOP may be electrically connected to the first pad unit 141 located on the first substrate 110.

The second out pad unit OP2 may be substantially the same as the first out pad unit OP1. Accordingly, the first out pad unit OP1 will mainly be described below. Descriptions of the first out pad unit OP1 may be applied to the second out pad unit OP2.

The first out pad unit OP1 may include a first out pad O1, a second out pad O2, a dummy out pad DO, and a third out pad O3, which are arranged in the first direction d1.

In an exemplary embodiment, the second film pad unit FP2 may include a driving in pad unit DIP, a first in pad unit IP1 located at a left side L of the driving in pad unit DIP, and a second in pad unit IP2 located at a right side R of the driving in pad unit DIP.

The driving in pad unit DIP may include a plurality of driving in pads 157 arranged in the first direction d1. The driving in pad unit DIP may be electrically connected to a PCB FPC that will be described below.

The second in pad unit IP2 may be substantially the same as the first in pad unit IP1.

Accordingly, the first in pad unit IP1 will mainly be described below. Descriptions of the first in pad unit IP1 may be applied to the second in pad unit IP2.

The first in pad unit IP1 may include a first in pad I1, a second in pad I2, a third in pad I3, a fourth in pad I4, and a fifth in pad I5, which are arranged in the first direction d1.

Hereinafter, the circuit film CF will be described in more detail with reference to FIG. 4.

FIG. 4 illustrates a rear surface of the circuit film CF, which is different from that shown in FIG. 1. FIG. 1 illustrates a front surface of the circuit film CF. Thus, the left side L and the right side R of FIG. 1 may be reversed in FIG. 4. Also, it should be noted in advance that a first direction d1 of FIG. 4 is reversed to that of FIG. 1.

In an exemplary embodiment, the circuit film CF may include a plurality of conductive lines and a driving integrated circuit (IC) 130, which are located between the first film pad unit FP1 and the second film pad unit FP2.

The driving IC 130 may be located between the driving in pad unit DIP and the driving out pad unit DOP.

The driving IC 130 may be electrically connected to the driving in pad unit DIP and the driving out pad unit DOP. To this end, a plurality of driving in lines DIL may be provided between the driving IC 130 and the driving in pad unit DIP, and a plurality of driving out lines DOL may be located between the driving IC 130 and the driving out pad unit DOP.

The driving IC 130 may generate a plurality of scan signals S (see FIG. 2) and/or a plurality of data signals D (see FIG. 2) in response to a signal provided through the PCB FPC and provide the plurality of scan signals S and the plurality of data signals D to the plurality of pixel units PX.

A first line L1, a second line L2, a dummy line DL, and a third line D3 may be located between the first out pad unit OP1 and the first in pad unit IP1.

The first line L1 may electrically connect the first out pad O1 with the first in pad I1 and the second in pad I2.

In an exemplary embodiment, the first line L1 may be branched into a first sub-line 241 and a second sub-line 242 at a first branch point BP1. In this case, the first sub-line 241 may be electrically connected to the first in pad I1, and the second sub-line 242 may be electrically connected to the second in pad I2.

The second line L2 may electrically connect the second out pad O2 with the third in pad I3 and the fourth in pad I4.

In an exemplary embodiment, the second line L2 may be branched into a third sub-line 243 and a fourth sub-line 244 at a second branch point BP2. In this case, the third sub-line 243 may be electrically connected to the third in pad I3, and the fourth sub-line 244 may be electrically connected to the fourth in pad I4.

In an exemplary embodiment, the dummy out pad DO may be connected to the dummy line DL. However, the dummy line DL may not be electrically connected to the first in pad unit IP1.

The third line L3 may electrically connect the third out pad O3 with the fifth in pad I5.

In an exemplary embodiment, the circuit film CF may include a cover layer CL, which partially covers the first line L1, the second line L2, and the third line L3.

In an exemplary embodiment, the cover layer CL may include an organic insulating material. The cover layer CL may serve to protect the first line L1, the second line L2, and the third line L3.

In an exemplary embodiment, the second branch point BP2 may be covered with the cover layer CL. In other words, the second branch point BP2 may overlap the cover layer CL. The second branch point BP2 may include a bent portion and be less durable than other lines. When the second branch point BP2 is covered with the cover layer CL, the vicinity of the second branch point BP2 may be prevented from being damaged due to external stimulus.

Referring back to FIG. 1, the display device 10 according to the exemplary embodiment may include the PCB FPC connected to the circuit film CF.

The circuit film CF may be located between the PCB FPC and the first substrate 110. Thus, the PCB FPC may be electrically connected to the first substrate 110 by the circuit film CF.

The PCB FPC may include a substrate pad unit SP, a plurality of conductive lines, a first test pad unit TP1, and a second test pad unit TP2. The substrate pad unit SP may be electrically connected to the second film pad unit FP2 of the circuit film CF. That is, a plurality of pads included in the second film pad unit FP2 may correspond and be electrically connected to a plurality of pads included in the substrate pad unit SP one-to-one, one-to-n, or n-to-one.

The second film pad unit FP2 may be electrically connected to the substrate pad unit SP by an anisotropic conductive film interposed therebetween. Here, the anisotropic conductive film may include an adhesive resin and a plurality of conductive particles dispersed in the adhesive resin.

However, a method of connecting the second film pad unit FP2 with the substrate pad unit SP is not limited thereto. In another exemplary embodiment, the second film pad unit FP2 may be connected to the substrate pad unit SP by bringing each of the pads of the second film pad unit FP2 into direct contact with a corresponding one of the pads of the substrate pad unit SP.

The substrate pad unit SP may include a signal pad unit SNP, a first test terminal unit TT1 located at a left side L of the signal pad unit SNP, and a second test terminal unit TT2 located at a right side R of the signal pad unit SNP.

The signal pad unit SNP may include a plurality of signal pads 158 arranged in the first direction d1. The plurality of signal pads 158 may be electrically connected to the driving in pads 157 corresponding thereto.

Each of the first test terminal unit TT1 and the second test terminal unit TT2 may include a first terminal 191, a second terminal 192, a third terminal 193, a fourth terminal 194, and a fifth terminal 195.

The first test terminal unit TT1 may be substantially the same as the second test terminal unit TT2. Accordingly, the first test terminal unit TT1 will mainly be described below. Descriptions of the first test terminal unit TT1 may be applied to the second test terminal unit TT2.

The first terminal 191, the second terminal 192, the third terminal 193, the fourth terminal 194, and the fifth terminal 195 may be respectively electrically connected to the first in pad I1, the second in pad I2, the third in pad I3, the fourth in pad I4, and the fifth in pad I5 of the circuit film CF.

Specifically, the first terminal 191, the second terminal 192, the third terminal 193, the fourth terminal 194, and the fifth terminal 195 may overlap the first in pad I1, the second in pad I2, the third in pad I3, the fourth in pad I4, and the fifth in pad I5, and may be in direct contact with or electrically connected to the first in pad I1, the second in pad I2, the third in pad I3, the fourth in pad I4, and the fifth in pad I5, respectively, through an anisotropic conductive film.

The first test pad unit TP1 may be located adjacent to the first test terminal unit TT1, and the second test pad unit TP2 may be located adjacent to the second test terminal unit TT2.

Each of the first test pad unit TP1 and the second test pad unit TP2 may include a first test pad T1, a second test pad T2, a third test pad T3, a fourth test pad T4, and a fifth test pad T5.

Since the first test pad unit TP1 is substantially the same as the second test pad unit TP2, the first test pad unit TP1 will mainly be described below for convenience of description.

The first test pad unit TP1 may be electrically connected to the first test terminal unit TT1 and will be described in detail below.

The first test pad T1, the second test pad T2, the third test pad T3, the fourth test pad T4, and the fifth test pad T5 may be connected to the first terminal 191, the second terminal 192, the third terminal 193, the fourth terminal 194, and the fifth terminal 195, respectively.

To this end, a first test line TL1 may be located between the first test pad T1 and the first terminal 191, a second test line TL2 may be located between the second test pad T2 and the second terminal 192, a third test line TL3 may be located between the third test pad T3 and the third terminal 193, a fourth test line TL4 may be located between the fourth test pad T4 and the fourth terminal 194, and a fifth test line TL5 may be located between the fifth test pad T5 and the fifth terminal 195.

Hereinafter, a display device 10 according to the exemplary embodiment will be described with reference to FIG. 5. In an exemplary embodiment, the first substrate 110 may be bonded to one side of the circuit film CF, and the PCB FPC may be bonded to the other side of the circuit film CF.

FIG. 5 illustrates a state in which the first substrate 110 and the PCB FPC are bonded to the circuit film CF.

In an exemplary embodiment, the first substrate 110 and the circuit film CF may be bonded to each other. Specifically, the output pad unit 140 of the first substrate 110 and the first film pad unit FP1 of the circuit film CF may overlap each other and be bonded to each other.

As described above, the output pad unit 140 of the first substrate 110 may be bonded to the first film pad unit FP1 of the circuit film CF with the anisotropic conductive film interposed therebetween. Thus, in the display device 10 according to the exemplary embodiment of the present disclosure, a region where the output pad unit 140 of the first substrate 110 overlaps the first film pad unit FP1 of the circuit film CF may be defined as a first bonding region 341.

In an exemplary embodiment, the first bonding region 341 may include a first out bonding region 451 and a second out bonding region 452, which are spaced apart from each other and located on both sides of the first bonding region 341.

The first out bonding region 451 may be defined as a region where the first inspection pad unit 145 overlaps the first out pad unit OP1. The second out bonding region 452 may be defined as a region where the second inspection pad unit 146 overlaps the second out pad unit OP2.

That is, the first inspection pad unit 145 may be bonded to the first out pad unit OP1 in the first out bonding region 451, and the second inspection pad unit 146 may overlap the second out pad unit OP2 in the second out bonding region 452.

Each of the first out bonding region 451 and the second out bonding region 452 may include a first out bonding unit OB1, a second out bonding unit OB2, a dummy out bonding unit DOB, and a third out bonding unit OB3.

The first out bonding unit OB1 may be formed by bonding the first inspection pad P1 of the first substrate 110 to the first out pad O1 of the circuit film CF. That is, the first out bonding unit OB1 may include the first inspection pad P1 and the first out pad O1, which are electrically connected to each other.

The second out bonding unit OB2 may be formed by bonding the second inspection pad P2 of the first substrate 110 to the second out pad O2 of the circuit film CF. That is, the second out bonding unit OB2 may include the second inspection pad P2 and the second out pad O2, which are electrically connected to each other.

The dummy out bonding unit DOB may be formed by bonding the dummy inspection pad DP of the first substrate 110 to the dummy out pad DO of the circuit film CF. That is, the dummy out bonding unit DOB may include the dummy inspection pad DP and the dummy out pad DO, which are electrically connected to each other.

The third out bonding unit OB3 may be formed by bonding the third inspection pad P3 of the first substrate 110 to the third out pad O3 of the circuit film CF. That is, the third out bonding unit OB3 may include the third inspection pad P3 and the third out pad O3, which are electrically connected to each other.

In an exemplary embodiment, the PCB FPC and the circuit film CF may be bonded to each other. Specifically, the substrate pad unit SP of the PCB FPC may overlap and be bonded to the second film pad unit FP2 of the circuit film CF.

As described above, the substrate pad unit SP of the PCB FPC may be bonded to the second film pad unit FP2 of the circuit film CF with the anisotropic conductive film therebetween. Thus, in the display device 10 according to the exemplary embodiment, a region where the substrate pad unit SP of the PCB FPC overlaps the second film pad unit FP2 of the circuit film CF may be defined as a second bonding region 342.

In an exemplary embodiment, the second bonding region 342 may include a first in bonding region 551 and a second in bonding region 552, which are spaced apart from each other and located on both sides of the second bonding region 342.

The first in bonding region 551 may be defined as a region where the first in pad unit IP1 of the circuit film CF overlaps the first test terminal unit TT1 of the PCB FPC.

The second in bonding region 552 may be defined as a region where the second in pad unit IP2 of the circuit film CF overlaps the second test terminal unit TT2 of the PCB FPC.

Each of the first in bonding region 551 and the second in bonding region 552 may include a first in bonding unit IB1, a second in bonding unit IB2, a third in bonding unit IB3, a fourth in bonding unit IB4, and a fifth in bonding unit IB5.

The first in bonding unit IB1 may be formed by bonding the first in pad I1 of the circuit film CF to the first terminal 191 of the PCB FPC. That is, the first in bonding unit IB1 may include the first in pad I1 and the first terminal 191, which are electrically connected to each other.

The second in bonding unit IB2 may be formed by bonding the second in pad I2 of the circuit film CF to the second terminal 192 of the PCB FPC. That is, the second in bonding unit IB2 may include the second in pad I2 and the second terminal 192, which are electrically connected to each other.

The third in bonding unit IB3 may be formed by bonding the third in pad I3 of the circuit film CF to the third terminal 193 of the PCB FPC. That is, the third in bonding unit IB3 may include a third in pad I3 and a third terminal 193, which are electrically connected to each other.

The fourth in bonding unit IB4 may be formed by bonding the fourth in pad I4 of the circuit film CF to the fourth terminal 194 of the PCB FPC. That is, the fourth in bonding unit IB4 may include a fourth in pad I4 and a fourth terminal 194, which are electrically connected to each other.

The fifth in bonding unit IB5 may be formed by bonding the fifth in pad I5 of the circuit film CF to the fifth terminal 195 of the PCB FPC. That is, the fifth in bonding unit IB5 may include a fifth in pad I5 and a fifth terminal 195, which are electrically connected to each other.

Hereinafter, a display device according to an exemplary embodiment of the present disclosure and a method of measuring a resistance of a display device according to an exemplary embodiment of the present disclosure will be described with reference to FIG. 6.

FIG. 6 is an enlarged layout of portion A of FIG. 5.

Referring to FIG. 6, the first line L1, the second line L2, the dummy line DL, and the third line L3 may be located between the first out bonding region 451 and the first in bonding region 551.

The first line L1 may electrically connect the first out bonding unit OB1 with the first in bonding unit IB1 and the second in bonding unit IB2. To this end, the first line L1 may be branched into the first sub-line 241 and the second sub-line 242 at the first branch point BP1. In this case, the first sub-line 241 may be electrically connected to the first in bonding unit IB1, and the second sub-line 242 may be electrically connected to the second in bonding unit IB2.

The second line L2 may electrically connect the second out bonding unit OB2 with the third in bonding unit IB3 and the fourth in bonding unit IB4.

To this end, the second line L2 may be branched into the third sub-line 243 and the fourth sub-line 244 at the second branch point BP2. In this case, the third sub-line 243 may be electrically connected to the third in bonding unit IB3, and the fourth sub-line 244 may be electrically connected to the fourth in bonding unit IB4. In some embodiments, a distance between the first film pad unit FP1 and one of the branch points is about 300 μm or more.

In an exemplary embodiment, the dummy line DL may extend from the dummy out bonding unit DOB. However, the dummy line DL may not be electrically connected to a plurality of in bonding units.

The third line L3 may electrically connect the third out bonding unit OB3 with the fifth in bonding unit IB5.

Hereinafter, a method of measuring a resistance of a display device according to an exemplary embodiment of the present disclosure will be described.

Several assumptions may be made to describe the method of measuring a resistance of a display device. In an exemplary embodiment, the first to fifth test lines TL1 to TL5 may have substantially the same length. Thus, it may be assumed that the first to fifth test lines TL1 to TL5 have substantially the same resistance.

The first to fifth in bonding units IB1 to IB5 may have substantially the same shape so that resistances of the first to fifth in bonding units IB1 to IB5 may be substantially the same. Also, even when there are differences between the resistances of the first to fifth in bonding units IB1 to IB5, the differences may be negligible.

The first to third out bonding units OB1 to OB3 may have substantially the same shape so that resistances of the first to third out bonding units OB1 to OB3 may be substantially the same. Also, even when there are differences between the first to third out bonding units OB1 to OB3, the differences may be negligible.

In FIG. 6, a width of an interconnection extending in a traverse direction may be negligibly small as compared with a length of the interconnection extending in a longitudinal direction, because a pitch between interconnections is very small. Accordingly, a resistance existing in the interconnection extending in the traverse direction may be negligible.

The method of measuring a resistance according to the exemplary embodiment may include measuring a resistance existing in the first test line TL1, the second test line TL2, the first in bonding unit IB1, and the second in bonding unit IB2 by connecting one terminal of a voltmeter having two terminals to the first test pad T1 and connecting the other terminal of the voltmeter to the second test pad T2. For brevity, the resistance existing in the first test line TL1, the second test line TL2, the first in bonding unit IB1, and the second in bonding unit IB2 will be referred to as a first resistance.

When one terminal of the voltmeter having the two terminals is connected to the first test pad T1 and the other terminal of the voltmeter is connected to the second test pad T2, a closed circuit including the first test line TL1, the second test line TL2, the first in bonding unit IB1, and the second in bonding unit IB2 is formed. In this case, the first resistance may be measured by measuring voltage of the closed circuit.

A method of measuring a resistance according to an exemplary embodiment may include measuring a resistance of the third test line TL3, the third in bonding unit IB3, the third sub-line 243, the fourth sub-line 244, the fourth in bonding unit IB4, and the fourth test line TL4 by connecting one terminal of a voltmeter having two terminals to the third test pad T3 and connecting the other terminal of the voltmeter to the fourth test pad T4. For brevity, a resistance existing in the third test line TL, the third in bonding unit IB3, the third sub-line 243, the fourth sub-line 244, the fourth in bonding unit IB4, and the fourth test line TL4 will be referred to as a second resistance.

When one terminal of the voltmeter having the two terminals is connected to the third test pad T3 and the other terminal of the voltmeter is connected to the fourth test pad T4, a closed circuit including the third test line TL3, the third in bonding unit IB3, the third sub-line 243, the fourth sub-line 244, the fourth in bonding unit IB4, and the fourth test line TL4 is formed. In this case, the second resistance may be measured by measuring a voltage of the closed circuit.

On the above-described assumptions, a value obtained by subtracting the first resistance from the second resistance may be substantially equal to the sum of a resistance existing in the third sub-line 243 and a resistance existing in the fourth sub-line 244. That is, a resistance of the conductive line included in the circuit film CF may be measured using the above-described method of measuring the resistance.

The method of measuring a resistance according to an exemplary embodiment may include measuring a resistance of the second out bonding unit OB2 by using a resistance tester including four terminals.

The resistance tester may include an ammeter including a first terminal and a second terminal and a voltmeter including a third terminal and a fourth terminal.

In an exemplary embodiment, the first terminal and the second terminal may be connected to the second test pad T2 and the third test pad T3, respectively, the third terminal may be connected to the fourth test pad T4, and the fourth terminal may be connected to the fifth test pad T5.

In this case, when a predetermined current is supplied by the ammeter, a circuit including the second test line TL2, the second in bonding unit IB2, the first line L1, the first out bonding unit OB1, and the second out bonding unit OB2 is formed. In this case, the fourth sub-line 244 connected to the fourth test pad T4 and the bridge BR and the voltmeter, which are connected to the fifth test pad T5, may be connected in parallel on the basis of the second out bonding unit OB2. That is, a resistance existing in the second out bonding unit OB2 may be measured using the voltmeter connected to the fourth test pad T4 and the fifth test pad T5.

Hereinafter, a display device according to another exemplary embodiment of the present disclosure will be described. Some of components to be described below may be substantially the same as those of the display device according to the above-described exemplary embodiment of the present disclosure, and descriptions of some components may be omitted for brevity.

Figure 7:
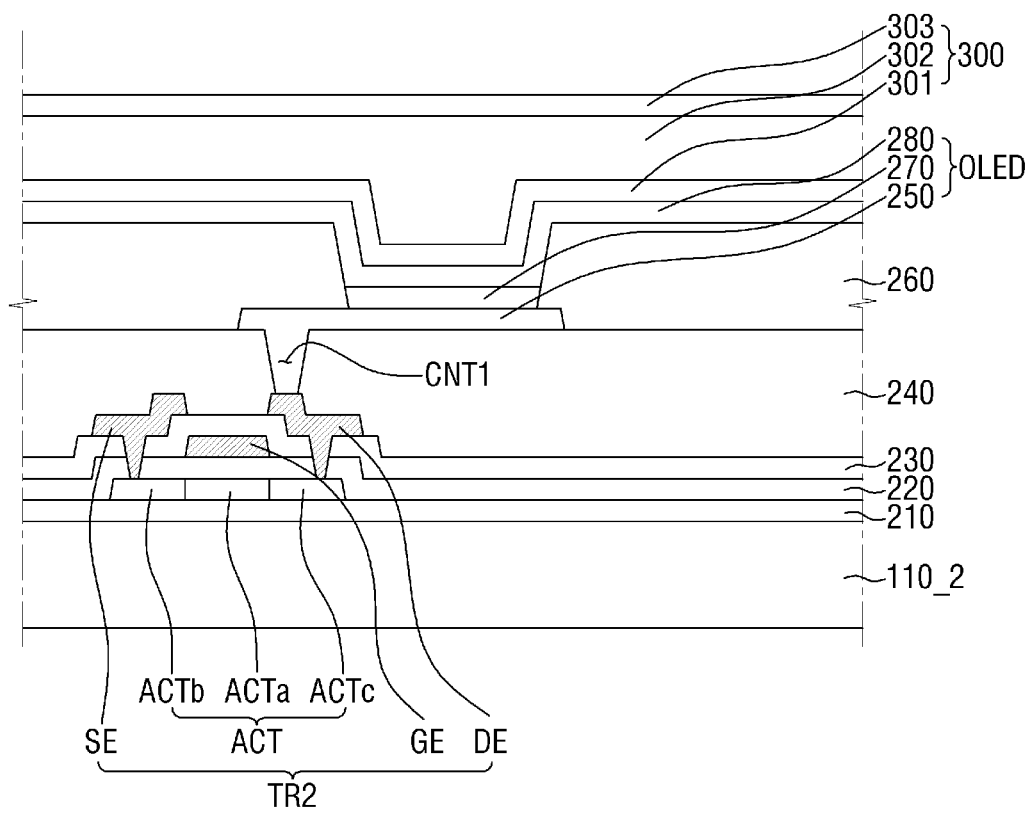
FIG. 7 is a cross-sectional view of a display device according to another exemplary embodiment of the present disclosure.

FIG. 7 is a cross-sectional view of a display device according to an exemplary embodiment of the present disclosure. Referring to FIG. 7, in an exemplary embodiment, an encapsulation layer 300 may be located on a first substrate 110_2.

The encapsulation layer 300 may prevent external moisture and air from penetrating an organic light emitting diode OLED. In an exemplary embodiment, the encapsulation layer 300 may include a first inorganic layer 301, an organic layer 302, and a second inorganic layer 303.

The first inorganic layer 301 may be located on the common electrode 280. The first inorganic layer 301 may include at least one selected from the group consisting of silicon oxide (SiOx), silicon nitride (SiNx), and silicon oxynitride (SiONx).

The organic layer 302 may be located on the first inorganic layer 301. The organic layer 302 may include any one selected from the group consisting of epoxy, acrylate, and urethane acrylate. The organic layer 302 may planarize steps caused by the pixel defining film 260.

The second inorganic layer 303 may be located on the organic layer 302. The second inorganic layer 303 may include at least one selected from the group consisting of silicon oxide ($SiO_x$), silicon nitride ($SiN_x$), and silicon oxynitride ($SiON_x$).

Although FIG. 7 illustrates a case in which each of the first inorganic layer 301, the organic layer 302, and the second inorganic layer 303 is a single layer, the present disclosure is not limited thereto. That is, at least one of the first inorganic layer 301, the organic layer 302, and the second inorganic layer 303 may have a multilayered structure.

In another exemplary embodiment, an encapsulation layer 300 may include a hexamethyldisiloxane (HMDSO) layer. More specifically, the encapsulation layer 300 may include a first inorganic layer 301, a second inorganic layer 303, and the HMDSO layer located between the first inorganic layer 301 and the second inorganic layer 303. That is, the above-described organic layer 302 may be replaced by the HMDSO layer.

In an exemplary embodiment, the HMDSO may be formed using the same chamber as the first inorganic layer 301 after the first inorganic layer 301 is formed. Thus, a process of forming the encapsulation layer 300 may be simplified. Also, the encapsulation layer 300 may include the HMDSO layer capable of absorbing stress and thus have sufficient flexibility.

Figure 8:
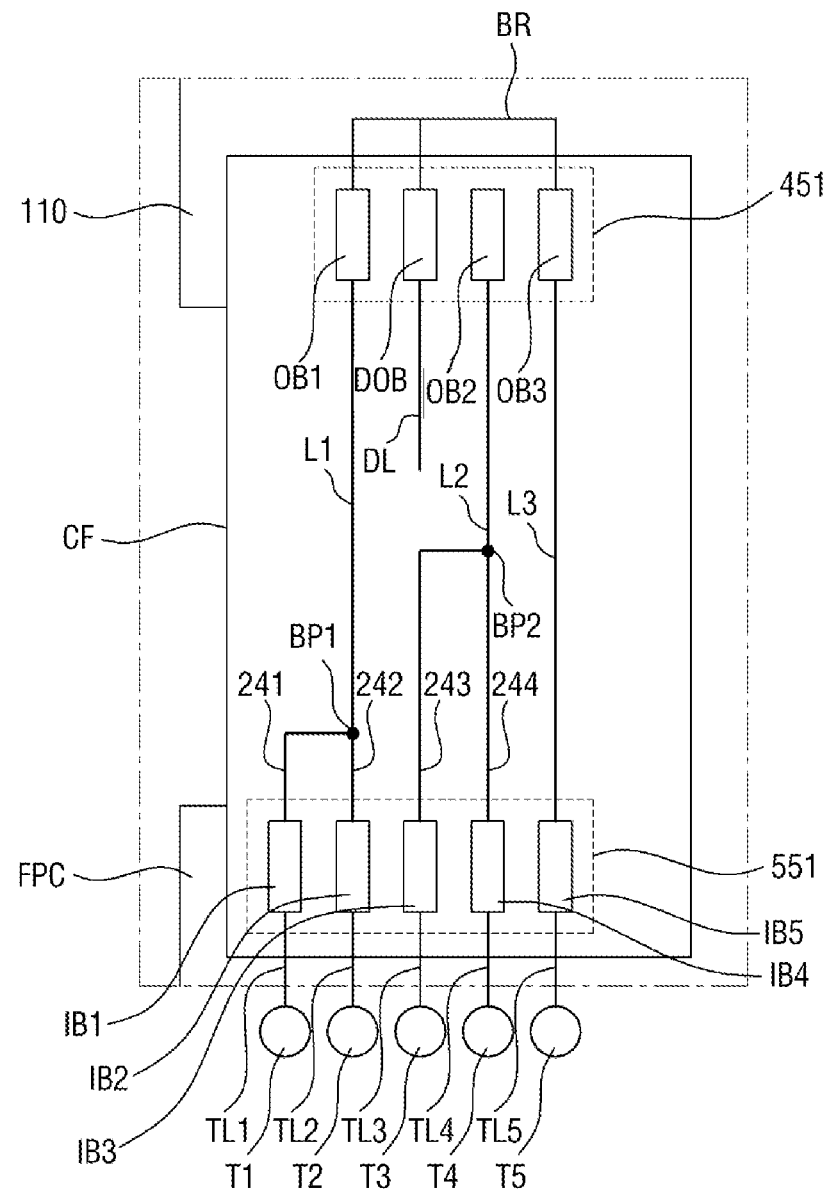
FIG. 8 is an enlarged layout of portion A of FIG. 5 according to another exemplary embodiment of the present disclosure.

FIG. 8 is an enlarged layout of portion A of FIG. 5 according to another exemplary embodiment of the present disclosure. FIG. 8 illustrates a modified example of the exemplary embodiment of FIG. 6.

The exemplary embodiment of FIG. 8 differs from the exemplary embodiment of FIG. 6 in that a dummy out bonding unit DOB is located between a first out bonding unit OB1 and a second out bonding unit OB2. Other components except for a position of the dummy out bonding unit DOB may be substantially the same as those described with reference to FIG. 6. Thus, detailed descriptions thereof will be omitted.

Figure 9:
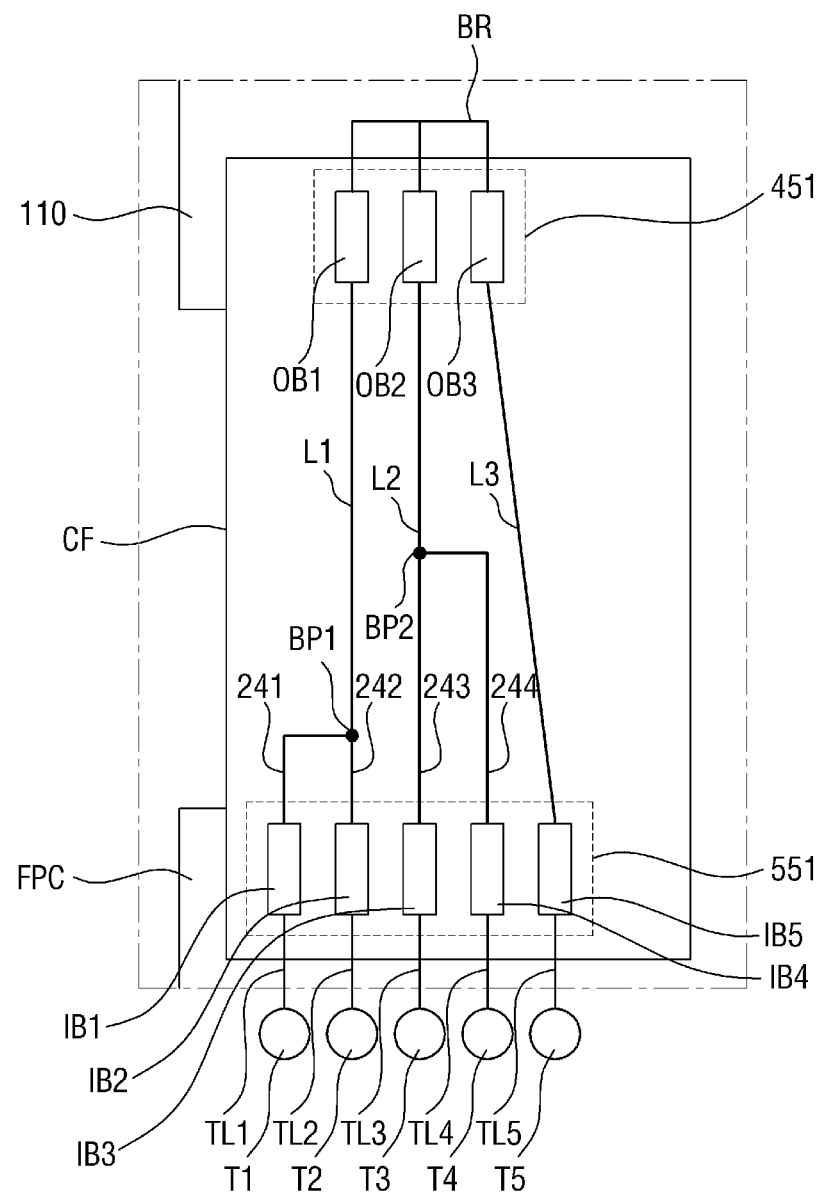
FIG. 9 is an enlarged layout of portion A of FIG. 5 according to another exemplary embodiment of the present disclosure.

FIG. 9 is a partial enlarged view of a display device an enlarged layout of portion A of FIG. 5 according to another exemplary embodiment of the present disclosure. FIG. 9 illustrates a modified example of the exemplary embodiment of FIG. 6.

Referring to FIG. 9, in an exemplary embodiment, a dummy out bonding unit DOB may be omitted.

In this case, a first out bonding region 451 may include a first out bonding unit OB1, a second out bonding unit OB2, and a third out bonding unit OB3, which are sequentially located.

The exemplary embodiment of FIG. 9 may be substantially the same as the exemplary embodiment of FIG. 6 except that the dummy out bonding unit DOB is omitted. Thus, detailed descriptions thereof will be omitted.

Figure 10:
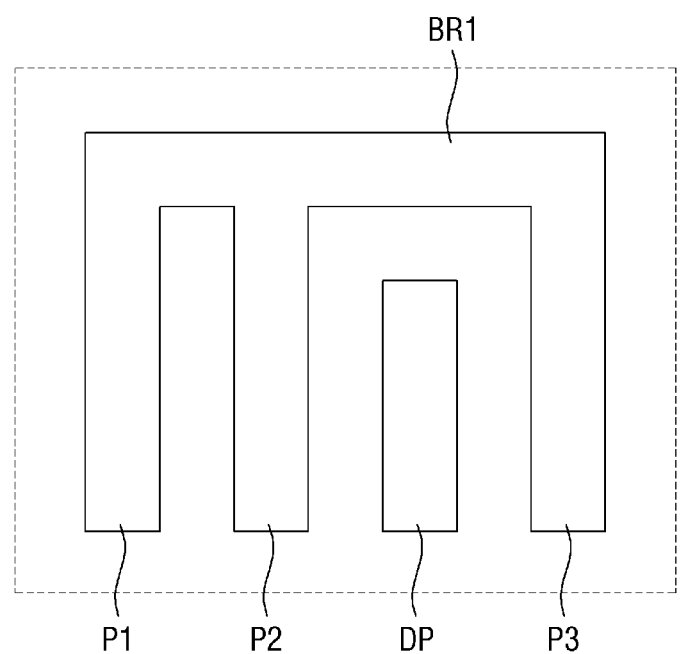
FIG. 10 is a partial enlarged view of a display device according to another exemplary embodiment of the present disclosure.

FIG. 10 is a partial enlarged view of a display device according to an exemplary embodiment of the present disclosure. FIG. 10 is an enlarged view of a first inspection pad unit 145 of the display device according to an exemplary embodiment of the present disclosure.

Referring to FIG. 10, in an exemplary embodiment, a bridge BR1 may electrically connect a first inspection pad P1, a second inspection pad P2, and a third inspection pad P3.

In an exemplary embodiment, the first inspection pad P1, the second inspection pad P2, and the third inspection pad P3 may include the same material as a source electrode SE or a drain electrode DE of a pixel unit PX. Also, the first inspection pad P1, the second inspection pad P2, and the third inspection pad P3 may be formed in the same layer as the source electrode SE or the drain electrode DE of the pixel unit PX.

In an exemplary embodiment, the bridge BR1 may include the same material as the source electrode SE or the drain electrode DE of the pixel unit PX.

That is, the first inspection pad P1, the second inspection pad P2, and the third inspection pad P3 may be formed on the same layer and include the same material as the bridge BR1.

In other words, the first inspection pad P1, the second inspection pad P2, and the third inspection pad P3 may be integrally formed with the bridge BR1.

The bridge BR1 of FIG. 10 may correspond to the bridge BR according to the exemplary embodiment shown in FIG. 6. That is, the dummy inspection pad DP may be located between the second inspection pad P2 and the third inspection pad P3 and not electrically connected to the bridge BR1.

Figure 11:
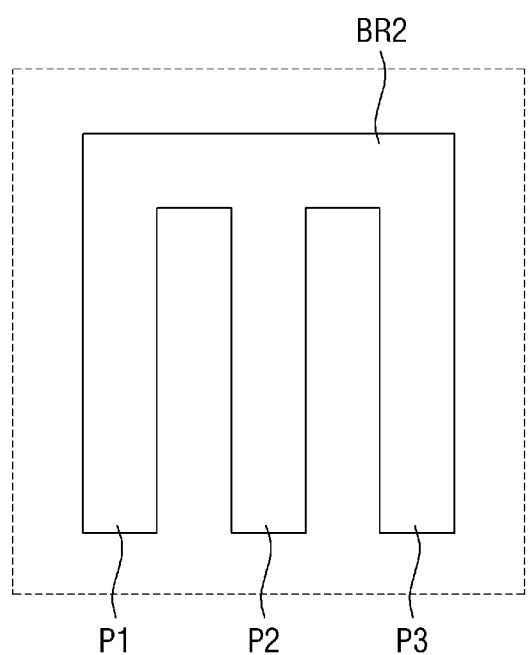
FIG. 11 is a partial enlarged view of a display device according to another exemplary embodiment of the present disclosure.

FIG. 11 is a partial enlarged view of a display device according to another exemplary embodiment of the present disclosure. FIG. 11 illustrates a modified example of the exemplary embodiment of FIG. 10.

In an exemplary embodiment, a dummy inspection pad DP may be omitted. Thus, a first inspection pad unit 145 may include a first inspection pad P1, a second inspection pad P2, and a third inspection pad P3, which are sequentially arranged.

In an exemplary embodiment, a bridge BR2 may be formed on the same layer and include the same material as the first inspection pad P1, the second inspection pad P2, and the third inspection pad P3. That is, the first inspection pad P1, the second inspection pad P2, and the third inspection pad P3 may be integrally formed with the bridge BR2.

According to exemplary embodiments of the present disclosure, a resistance existing in a display device can be measured in real-time during a process.

The effects of the present invention are not limited to the above-described examples, and more various effects are included in the present specification.

While the present invention has been described with reference to exemplary embodiments thereof, it is capable of various changes and modifications without departing from the spirit and scope of the invention. It should be appreciated that the scope of the invention is not limited to the detailed description of the invention hereinabove, which is intended merely to be illustrative, but rather comprehends the subject matter defined by the following claims.

What is claimed is:

1. A display device comprising:
   a first substrate including a display area in which a plurality of pixel units are located and a non-display area adjacent to the display area;
   a circuit film separated from the first substrate and connected to the first substrate;
   a printed circuit board (PCB) separated from the first substrate and the circuit film and connected to the circuit film; and
   a first inspection pad, a second inspection pad, and a third inspection pad located in the non-display area and
   a bridge configured to electrically connect the first inspection pad, the second inspection pad, and the third inspection pad,
   wherein the circuit film comprises:
   a first line electrically connected to the first inspection pad;
   a second line electrically connected to the second inspection pad;
   a third line electrically connected to the third inspection pad; and
   a branch point configured to branch at least one line selected from the first line, the second line, and the third line into two sub-lines,
   wherein the PCB comprises a test pad unit including a first test pad, a second test pad, a third test pad, a fourth test pad, and a fifth test pad and connected to the first line, the second line, and the third line,
   wherein the first inspection pad, the second inspection pad, and the third inspection pad are not electrically connected with the plurality of pixel units,
   wherein at least one of the first line, the second line, and the third line is directly connected to the test pad without passing the branch point, and
   wherein a total number of the first inspection pad, the second inspection pad, and the third inspection pad is less than a total number of the first test pad, the second test pad, the third test pad, the fourth test pad, and the fifth test pad.

2. The display device of claim 1, wherein the branch point comprises a first branch point configured to branch the first line into a first sub-line and a second sub-line and a second branch point configured to branch the second line into a third sub-line and a fourth sub-line.

3. The display device of claim 2,
   wherein the first sub-line is electrically connected to the first test pad, the second sub-line is electrically connected to the second test pad, the third sub-line is electrically connected to the third test pad, the fourth sub-line is electrically connected to the fourth test pad, and the third line is electrically connected to the fifth test pad.

4. The display device of claim 1, further comprising a dummy inspection pad located between the second inspection pad and the third inspection pad.

5. The display device of claim 1, further comprising a dummy inspection pad located between the first inspection pad and the second inspection pad.

6. The display device of claim 1, wherein the circuit film comprises a cover layer partially covering the first line, the second line, and the third line.

7. The display device of claim 6, wherein the cover layer covers the branch point.

8. The display device of claim 6, wherein the circuit film further comprises a film pad unit connected to the first substrate, and a distance between the film pad unit and the branch point is about 300 µm or more.

9. The display device of claim 1, wherein the bridge is integrated with the first inspection pad, the second inspection pad, and the third inspection pad.

10. A display device comprising:
a first substrate including a display area in which a plurality of pixel units are located and a non-display area adjacent to the display area;
a circuit film separated from the first substrate and connected to the first substrate;
a printed circuit board (PCB) separated from the first substrate and the circuit film and connected to the circuit film;
a first out bonding unit, a second out bonding unit, and a third out bonding unit configured to electrically connect the first substrate with the circuit film; and
a bridge located in the non-display area and configured to electrically connect the first out bonding unit, the second out bonding unit, and the third out bonding unit,
wherein the circuit film comprises:
a first line electrically connected to the first out bonding unit;
a second line electrically connected to the second out bonding unit;
a third line electrically connected to the third out bonding unit; and
a branch point configured to branch at least one line selected from the first line, the second line, and the third line into two sub-lines,
wherein the PCB comprises a test pad unit including a first test pad, a second test pad, a third test pad, a fourth test pad, and a fifth test pad and connected to the first line, the second line, and the third line,
wherein the first out bonding unit, the second out bonding unit, and the third out bonding unit are not electrically connected with the plurality of pixel units,
wherein at least one of the first line, the second line, and the third line is directly connected to the test pad without passing the branch point, and
wherein a total number of the first out bonding unit, the second out bonding unit, the third out bonding unit is less than a total number of the first test pad, the second test pad, the third test pad, the fourth test pad, and the fifth test pad.

11. The display device of claim 10, further comprising a first in bonding unit, a second in bonding unit, a third in bonding unit, a fourth in bonding unit, and a fifth in bonding unit configured to connect the circuit film with the PCB and arranged in a first direction.

12. The display device of claim 10, wherein the branch point comprises a first branch point configured to branch the first line into a first sub-line and a second sub-line and a second branch point configured to branch the second line into a third sub-line and a fourth sub-line,
wherein the first sub-line is electrically connected to the first in bonding unit, the second sub-line is electrically connected to the second in bonding unit, the third sub-line is electrically connected to the third in bonding unit, the fourth sub-line is electrically connected to the fourth in bonding unit, and the third line is electrically connected to the fifth in bonding unit.

13. The display device of claim 12, wherein:
the first sub-line is electrically connected to the first test pad, the second sub-line is electrically connected to the second test pad, the third sub-line is electrically connected to the third test pad, the fourth sub-line is electrically connected to the fourth test pad, and the third line is electrically connected to the fifth test pad.

14. The display device of claim 10, further comprising a dummy out bonding unit located between the second out bonding unit and the third out bonding unit.

15. The display device of claim 10, further comprising a dummy out bonding unit located between the first out bonding unit and the second out bonding unit.

16. The display device of claim 10, wherein a first bonding region in which the first substrate overlaps the circuit film is defined, and the first bonding region partially overlaps the bridge.

17. The display device of claim 10, wherein the circuit film comprises a cover layer partially covering the first line the second line and the third line.

18. A method of measuring a resistance of a display device, the method comprising:
preparing a display device comprising:
a first substrate including a display area in which a plurality of pixel units are located and a non-display area adjacent to the display area;
a circuit film separated from the first substrate and connected to the first substrate;
a printed circuit board (PCB) separated from the first substrate and the circuit film and connected to the circuit film;
a first out bonding unit, a second out bonding unit, and a third out bonding unit configured to electrically connect the first substrate with the circuit film;
a first in bonding unit, a second in bonding unit, a third in bonding unit, a fourth in bonding unit, and a fifth in bonding unit configured to electrically connect the circuit film with the PCB; and
a bridge located on the first substrate and configured to electrically connect the first out bonding unit, the second out bonding unit, and the third out bonding unit,
wherein the circuit film comprises a first line electrically connected to the first out bonding unit, a second line electrically connected to the second out bonding unit, a third line electrically connected to the third out bonding unit, a first branch point configured to branch the first line into a first sub-line and a second sub-line, and a second branch point configured to branch the second line into a third sub-line and a fourth sub-line,
the PCB comprises a first test pad, a second test pad, a third test pad, a fourth test pad, and a fifth test pad,
the first sub-line is electrically connected to the first test pad, the second sub-line is electrically connected to the second test pad, the third sub-line is electrically connected to the third test pad, the fourth sub-line is electrically connected to the fourth test pad, and the third line is electrically connected to the fifth test pad, wherein the first bonding unit, the second bonding unit, and the third bonding unit are not electrically connected with the plurality of pixel units, wherein at least one of the first line, the second line, and the third line is directly connected to the test pad without passing the branch point, and wherein a total number of the first out bonding unit, the second out bonding unit, the third out bonding unit is less than a total number of the first test pad, the second test pad, the third test pad, the fourth test pad, and the fifth test pad; and measuring a resistance existing in the first in bonding unit and the second in bonding unit by connecting two terminals of a voltmeter having the two terminals to the first test pad and the second test pad.

19. The method of claim 18, further comprising measuring a resistance existing in the third sub-line and the fourth sub-line by connecting the two terminals of a voltmeter having the two terminals to the third test pad and the fourth test pad.

20. The method of claim 18, further comprising measuring a resistance existing in the second out bonding unit by connecting four terminals of a resistance tester having the four terminals to the second test pad, the third test pad, the fourth test pad, and the fifth test pad.

* * * * *